United States Patent
Eslambolchi et al.

[11] Patent Number: 6,100,699
[45] Date of Patent: Aug. 8, 2000

[54] FAULTY FILTER DETECTION TECHNIQUE

[75] Inventors: Hossein Eslambolchi, Basking Ridge, N.J.; John Sinclair Huffman, McDonough, Ga.

[73] Assignee: AT&T Corp., New York, N.Y.

[21] Appl. No.: 08/968,702

[22] Filed: Nov. 12, 1997

[51] Int. Cl.[7] .................................................. G01R 31/28
[52] U.S. Cl. ............................................................ 324/529
[58] Field of Search ............................ 324/326, 67, 529, 324/329

[56] References Cited

U.S. PATENT DOCUMENTS

| | | | |
|---|---|---|---|
| 4,118,662 | 10/1978 | Weber | 324/326 |
| 4,143,251 | 3/1979 | Clark | 324/326 |
| 4,896,117 | 1/1990 | Floweredew | 324/326 |
| 5,361,029 | 11/1994 | Rider | 324/326 |
| 5,541,516 | 7/1996 | Rider | 324/326 |
| 5,767,678 | 6/1998 | Mercer | 324/326 |

*Primary Examiner*—Safet Metjahic
*Assistant Examiner*—Russell M. Kobert
*Attorney, Agent, or Firm*—Robert B. Levy

[57] ABSTRACT

To locate a defective one of filter/voltage arresters ($20_1$, $20_2$, $20_3$, $20_4$, ... $20_{n-1}$), each associated with a corresponding one of splice cases ($18_1$, $18_2$, $18_3$, $18_4$, ... $18_{n-n}$) on a buried fiber-optic cable (10), an operator employs a locating apparatus (24) to detect the presence of an AM signal within a prescribed frequency range that is radiated when the filter/voltage arrester becomes defective. By determining the location along the cable where the AM signal has its greatest strength, the operator can accurately establish the location of the defective filter/voltage arrester, thereby avoiding unnecessary excavation of each splice case.

7 Claims, 1 Drawing Sheet

FAULTY FILTER DETECTION TECHNIQUE

TECHNICAL FIELD

This invention relates to a technique for locating a damaged filter/voltage arrester of the type used for shunting lightning and/or voltage to ground from a splice case associated with a buried fiber-optic cable.

BACKGROUND ART

Many providers of telecommunications services, such as AT&T, maintain large networks of buried fiber-optic cables. Most buried fiber-optic cables have spices every three to five miles. At each splice location, the individual fibers of a cable segment and the cable sheath are bonded to fibers and sheath, respectively, of another cable segment. A water-resistant metallic enclosure (i.e., a splice case) encloses the splice to protect it from moisture. Each splice case typically lies a distance 5–10 feet underground to protect the splice from possible damage. A filter/voltage arrester, of a type known in the art, shunts lightning, and other unnecessary voltages, from the splice case to ground via a sufficiently high resistance path to protect the fiber-optic cable while minimizing leakage to ground of a locate signal impressed on the cable sheath.

While present day filter/voltage arresters generally provide effective protection from lightning and other unnecessary voltages, a close lightning strike may sufficiently damage the arrester, causing it to provide a direct (low resistance) path from the sheath to ground. Hence, a defective filter/voltage arrester will provide a low resistance path to ground for the locating signal impressed on the fiber-optic cable sheath. As a result, attempting to locate a fiber-optic cable by radio detection using the technique described in our U.S. Pat. No. 5,644,237, issued on Jul. 1, 1997 and assigned to AT&T (herein incorporated by reference), may not prove successful, giving rise to mislocation of the cable.

Present day techniques for locating a defective filter/voltage arrester consume a great deal of time and effort. Locating a defective filter/voltage arrester typically requires excavation of every splice case, necessitating not only a technician, but a backhoe and several contract laborers to perform this task. On average, digging up each splice case and testing each filter/voltage arrester takes 4–5 hours. Invariably most of the filter/voltage arresters are uncovered test defect-free, resulting in an unnecessary expenditure of time and effort.

Thus, there is a need for a technique for detecting a defective filter/voltage arrester that avoids the advantages of the prior art.

BRIEF SUMMARY OF THE INVENTION

Briefly, the present invention provides a technique for detecting a defective filter/voltage arrester that avoids the need to excavate every splice case. The method of the invention relies on our discovery that a defective filter/voltage arrester radiates an Amplitude Modulated (AM) signal in the frequency range of approximately 400 kHz to 900 kHz when the associated fiber-optic cable carries a locating signal in the range of 9 Hz to 33 kHz. From the knowledge that a defective filter/voltage arrester radiates an AM signal in the 400–900 kHz range, we can locate a defective filter/voltage arrester by sensing above ground, along the path of a fiber-optic cable, the point at which such a signal radiated by a defective filter/voltage arrester exhibits its greatest strength. The point at which the signal has its greatest strength corresponds to the location of the defective filter/voltage arrester. In this way, excavation of every splice case becomes unnecessary because splice cases whose associated filter/voltage arresters do not radiate the AM signal are not uncovered, thus saving time and money.

DETAILED DESCRIPTION

Figure 1:
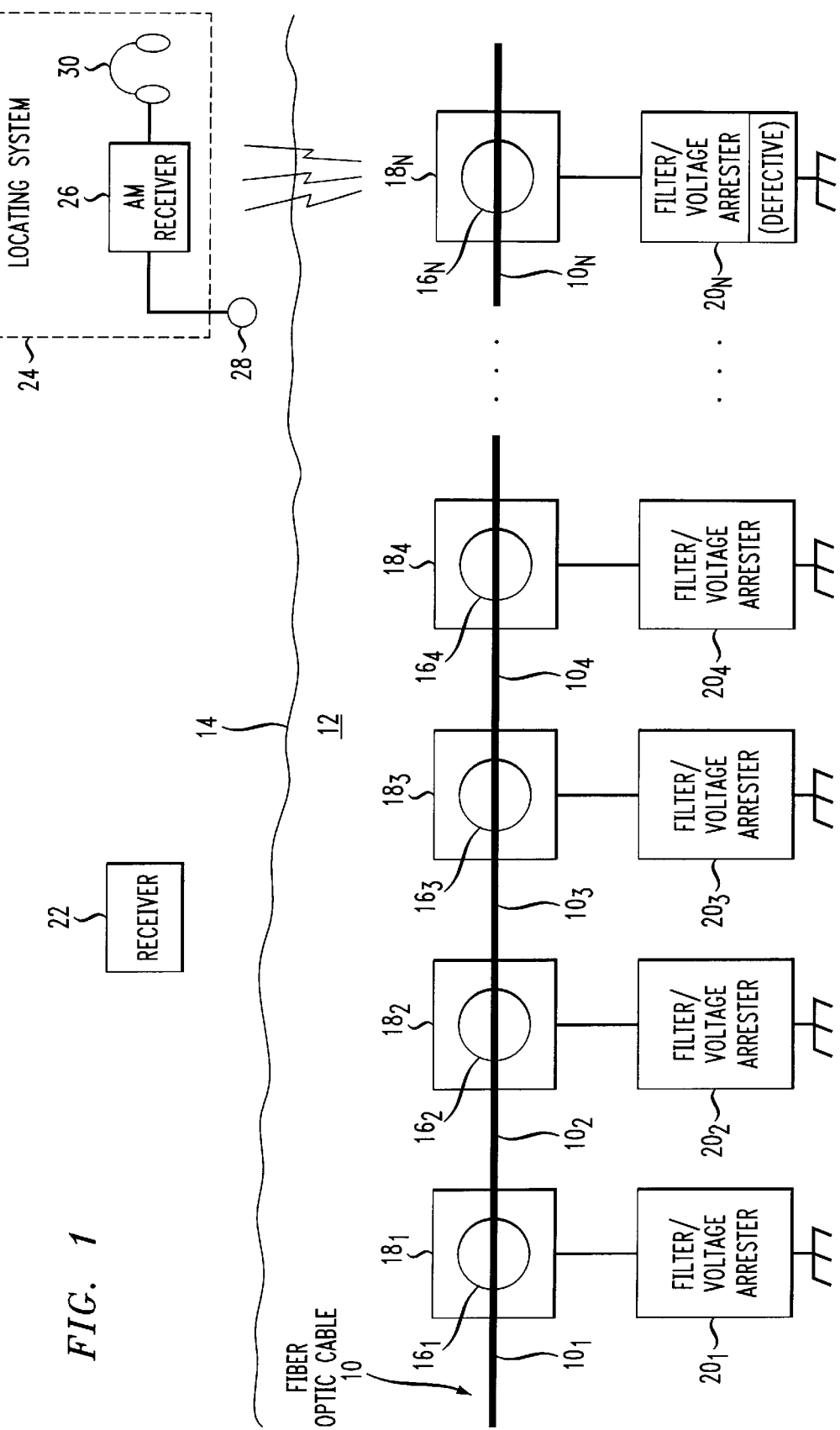
FIG. 1 is a block schematic diagram of a portion of a buried underground cable depicting the method of the invention for locating a defective filter/voltage arrester.

FIG. 1 depicts a portion of a fiber-optic cable 10 buried in the earth 12 a distance 5–10 feet below ground level, designated by the reference numeral 14. The fiber-optic cable 10 is conventional in its construction and includes one or more individual fibers (not shown) surrounded by a metallic sheath (not shown). In practice, the fiber-optic cable 10 actually comprises a plurality of individual cable segments $10_1, 10_2, 10_3 \ldots 10_n$ (where n is an integer greater than one). Each cable segment $10_{1-l}$ (where i is an integer <n) is joined to an adjacent cable segment $10_i$ by a corresponding one of splices $16_1, 16_2, 16_3, \ldots 16_{n-1}$, respectively. Surrounding each of the splices $16_1, 16_2, 16_3, 16_4 \ldots 16_{n-1}$ is a separate one of splice cases $18_1, 18_2, 18_3, 18_4, \ldots 18_{n-1}$, respectively. Each splice case typically comprises metallic housing, made from aluminum or the like. A separate one of filter/voltage arresters $20_1, 20_2, 20_3 20_4, \ldots 20_{n-1}$ couples a corresponding one of the splice cases $18_1, 18_2, 18_3, 18_4, \ldots 18_{n-1}$, respectively, to circuit ground to provide a path for shunting lightning and other unnecessary voltages away from the corresponding splice cases.

During normal operation, each of the filter/voltage arresters $20_1, 20_2, 20_3, 20_4, \ldots 20_n$ effectively shunts lightning and other unnecessary voltages to ground without leaking to ground a large amount of a locating signal impressed on the sheath of the fiber-optic cable 10. However, a lightning directly on, or in very close proximity to, a filter/voltage arrester often damages the filter/voltage arrester, causing it to provide a direct path to ground for the locate signal on the fiber-optic cable sheath. By shunting the locate signal directly to ground, a damaged (defective) filter/voltage arrester effectively prevents detection of the locate signal on the sheath by means of a receiver 22 located above ground level 14 in the manner taught by our prior U.S. Pat. No. 5,644,237 (herein incorporated by reference). Thus, a defective one of the filter/voltage arresters $20_1, 20_2, 20_3, 20_4, \ldots 20_{n-1}$ often causes a cable mis-locate when the receiver 22 cannot detect the locate signal.

In the past, locating a defective filter/voltage arrester required excavating each of the splice cases $18_1, 18_2, 18_3, 18_4, \ldots 18_{n-1}$ and testing each of the corresponding filter/voltage arresters $20_1, 20_2, 20_3, 20_4, \ldots 20_{n-1}$, respectively. Often, most of the filter/voltage arresters $20_1, 20_2, 20_3, 20_4, 20_{n-1}$ tested defect-free, giving rise to unnecessary effort and expense.

In accordance with the invention, we provide a technique for readily detecting a defective filter/voltage arrester that does not require excavation of every splice case. We have discovered that a defective filter/voltage arrester will radiate an Amplitude Modulated (AM) in the frequency range of 400–900 KHz when the associated fiber-optic cable carries a locating signal in the range of 9 Hz to 33 kHz on its sheath. From the knowledge that a defective filter/voltage arrester radiates an AM signal in the 400–900 KHz such a defective filter/voltage arrester can be located by sensing the point at which such a signal exhibits its greatest strength. To locate a defective filter/voltage arrester in accordance with the invention, we provide a locating system 24 comprised of an AM receiver 26 tuned to receive AM signals in the frequency band of 400–900 kHz that are above a minimum threshold, thereby eliminating the effects of noise and spurious signals not of interest. The receiver 26 utilizes an external antenna 28 in the form of a directional coil designed to accept RF signals within a relatively narrow footprint, to avoid reception of extraneous signals that could adversely affect detection of a defective filter/voltage arrester. The receiver 26 provides an audio output indicative of the strength of the received signal to a transducer 30, such as a head set worn by an operator (not shown).

To locate a defective filter/voltage arrester, an operator displaces the coil 28 of the locating system 24 along the path of the buried fiber-optic cable 10. (In practice, the operator will know the general location of the fiber-optic cable 10 from a map or past locate data.) The operator displaces the coil 28 along the path of the fiber-optic cable 22 until such time as the operator hears an indication, provided through the headset 30, of a maximum amplitude signal in the 400–900 kHz range, presumably radiated by a defective filter/voltage arrester. The location at which the operator detects the maximum amplitude 400–900 kHz corresponds to the location of a defective filter/voltage arrester. The location of the defective filter/voltage arrester is excavated to facilitate repair or replacement of the filter/voltage arrester. 29-13

Using the detection method described above greatly reduces the need for unnecessary excavation and the associated cost. Those of the filter/voltage arresters $20_1, 20_2, 20_3, 20_4, \ldots 20_{n-1}$ that are not defective radiate little if any signals in the 400–900 kHz range. Thus, an operator using the locating system 24 will not detect such a signal and would not commence excavation of any of the splice cases $18_1, 18_2, 18_3, 18_4, \ldots 18_{n-1}$ associated with a non-defective filter/voltage arrester. Only when the operator using the locating system 24 senses an AM signal in the 400–900 kHz above a certain threshold would the operator initiate excavation.

The foregoing discloses a technique for detecting a defective filter/voltage arrester by sensing whether the filter/voltage arrester radiates an AM signal above ground level in a prescribed frequency band (400–900 kHz), thereby avoiding the need for necessary excavation and the cost associated therewith.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for locating a defective filter/voltage arrester associated with a splice case on a buried fiber-optic cable that carries a locate signal on its sheath, comprising the steps of:

sensing, above ground, the presence of an Amplitude-Modulated signal radiated in the frequency range of 400–900 kHz from a defective filter/voltage arrester;

determining, the location, at which the Amplitude Modulated signal has its greatest strength by eliminating extraneous signals below the 400 kHz frequency range; and excavating at the location at which the Amplitude Modulated signal has its greatest strength to locate the defective filter/voltage arrester.

2. The method according to claim 1 wherein the locate signal on the sheath of the fiber-optic lies in a frequency range of approximately 9 Hz to 33 kHz and wherein the Amplitude Modulated signal lies in the frequency range of 400–900 kHz.

3. The method according to claim 1 wherein the sensing step comprises the step of displacing a directional coil, adapted to receive RF signals within a narrow foot print, along a path of the cable.

4. The method according to claim 3 wherein the path of the cable is determined from a map.

5. The method according to claim 3 wherein the path of the cable is determined from prior radio detection data.

6. Apparatus for locating a defective filter/voltage arrester associated with a splice case on a buried fiber-optic cable that carries a locate signal on its sheath, comprising:

a directional antenna for detecting, within narrow footprint, an Amplitude Modulated (AM) signal of a prescribed frequency range that is radiated by a defective filter/voltage arrester when the fiber-optic cable carries a locate signal on its sheath;

an AM receiver coupled to the antenna for receiving said AM signal when said AM signal is above a prescribed strength; and an audio transducer coupled to said AM receiver for providing an audible indication of the strength of the AM signal received by said receiver.

7. The apparatus according to claim 6 wherein the AM receiver is tuned to receive AM signals in the frequency range of 400–900 kHz radiated by a defective filter/voltage arrester when the locate signal on the fiber-optic cable is within the frequency range of 9 Hz to 33 kHz.

* * * * *